(12) United States Patent
Kishimoto

(10) Patent No.: US 9,668,393 B2
(45) Date of Patent: May 30, 2017

(54) SUBSTRATE FIXING APPARATUS AND SUBSTRATE WORKING APPARATUS

(71) Applicant: YAMAHA HATSUDOKI KABUSHIKI KAISHA, Iwata-shi, Shizuoka-ken (JP)

(72) Inventor: Youhei Kishimoto, Iwata (JP)

(73) Assignee: YAMAHA HATSUDOKI KABUSHIKI KAISHA, Shizuoka-ken (JP)

( * ) Notice: Subject to any disclaimer, the term of this patent is extended or adjusted under 35 U.S.C. 154(b) by 420 days.

(21) Appl. No.: 14/173,577

(22) Filed: Feb. 5, 2014

(65) Prior Publication Data

US 2014/0215813 A1 Aug. 7, 2014

(30) Foreign Application Priority Data

Feb. 6, 2013 (JP) ................................. 2013-021307

(51) Int. Cl.
*H05K 13/00* (2006.01)
*H05K 13/08* (2006.01)

(52) U.S. Cl.
CPC ......... *H05K 13/08* (2013.01); *H05K 13/0069* (2013.01); *Y10T 29/532* (2015.01); *Y10T 29/53174* (2015.01); *Y10T 29/53191* (2015.01)

(58) Field of Classification Search
CPC ...... H01R 43/00; H01R 43/20; H01R 43/205; H05K 13/0069; H05K 13/08; Y10T 29/53174; Y10T 29/53191; Y10T 29/532
See application file for complete search history.

(56) References Cited

U.S. PATENT DOCUMENTS

| 4,928,936 A | 5/1990 | Ohkubo et al. |
| 5,916,689 A | 6/1999 | Collins et al. |

(Continued)

FOREIGN PATENT DOCUMENTS

| CN | 100437995 C | 11/2008 |
| JP | H03-64989 A | 3/1991 |

(Continued)

OTHER PUBLICATIONS

Office Action issued by the Taiwanese Patent Office on Jan. 19, 2016, which corresponds to Taiwanese Patent Application No. 102132652 and is related to U.S. Appl. No. 14/173,577.

(Continued)

*Primary Examiner* — Carl Arbes

(74) *Attorney, Agent, or Firm* — Studebaker & Brackett PC

(57) ABSTRACT

A substrate fixing apparatus includes a back-up member which is located between a pair of conveying members arranged at a distance from each other in a plan view and is below a film-like substrate conveyed along the conveyance path and supported from below by the pair of conveying members. An elevation driver moves at least one of a back-up member and a substrate pressing member upward and downward. The elevation driver elevates the back-up member and/or lowers the substrate pressing member together with the pair of conveying members, thereby separating the substrate upward from the pair of conveying members while supporting the substrate from below by the back-up member and pressing the surface of the outer peripheral part of the substrate downward by the substrate pressing member to correct warpage of the outer peripheral part of the substrate.

18 Claims, 6 Drawing Sheets

(56) References Cited

U.S. PATENT DOCUMENTS

| | | |
|---|---|---|
| 6,206,352 B1 | 3/2001 | Ishitani et al. |
| 6,370,750 B1 * | 4/2002 | Matsumura ....... H01L 21/67132 156/286 |
| 7,340,872 B2 * | 3/2008 | Bosch ................. H05K 13/003 53/255 |
| 2005/0072358 A1 | 4/2005 | Katsuoka et al. |
| 2006/0043552 A1 | 3/2006 | Suga et al. |
| 2006/0243205 A1 | 11/2006 | Katsuoka et al. |
| 2009/0126187 A1 | 5/2009 | Kajiyama et al. |

FOREIGN PATENT DOCUMENTS

| | | |
|---|---|---|
| JP | H04-346299 A | 12/1992 |
| JP | H05-110297 A | 4/1993 |
| JP | H08-18293 A | 1/1996 |
| JP | 2000-307299 A | 11/2000 |
| JP | 2001-267794 A | 9/2001 |
| JP | 2002-134992 A | 5/2002 |
| JP | 2002-158498 A | 5/2002 |
| JP | 2003-086997 A | 3/2003 |
| JP | 2004-273756 A | 9/2004 |
| JP | 2004-296632 A | 10/2004 |
| JP | 2008-004856 A | 1/2008 |
| JP | 2008-186993 A | 8/2008 |
| KR | 2009-0028238 A | 3/2009 |
| TW | M353471 U | 3/2009 |
| TW | I313894 B | 8/2009 |
| WO | 01/35708 A2 | 5/2001 |

OTHER PUBLICATIONS

An Office Action; "Notification of Reasons for Refusal," issued by the Japanese Patent Office on May 10, 2016, which corresponds to Japanese Patent Application No. 2013-021307 and is related to U.S. Appl. No. 14/173,577.

A Chinese Office Action issued by Chinese Patent Office on Jun. 14, 2016, which corresponds to Chinese Patent Application No. 201310705898.8 and is related to U.S. Appl. No. 14/173,577.

The extended European search report issued by the European Patent Office on Jul. 21, 2015, which corresponds to European Patent Application No. 13005995.9-1905 and is related to U.S. Appl. No. 14/173,577.

"Notice of Allowance," issued by the Korean Patent Office on Jul. 14, 2015, which corresponds to Korean Patent Application No. 10-2013-0118546 and is related to U.S. Appl. No. 14/173,577.

An Office Action issued by the Korean Patent Office on Oct. 31, 2014, which corresponds to Korean Patent Application No. 10-2013-0118546 and is related to U.S. Appl. No. 14/173,577.

* cited by examiner

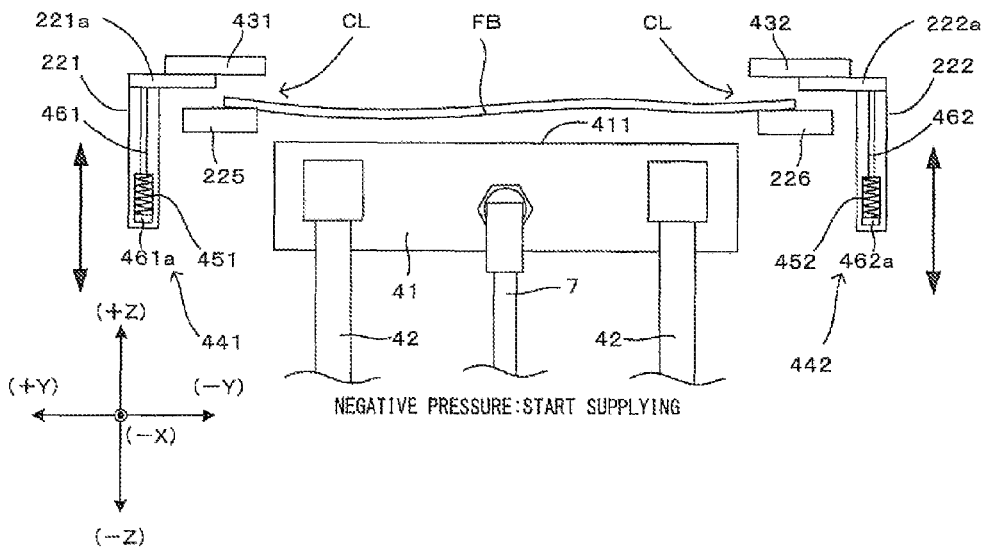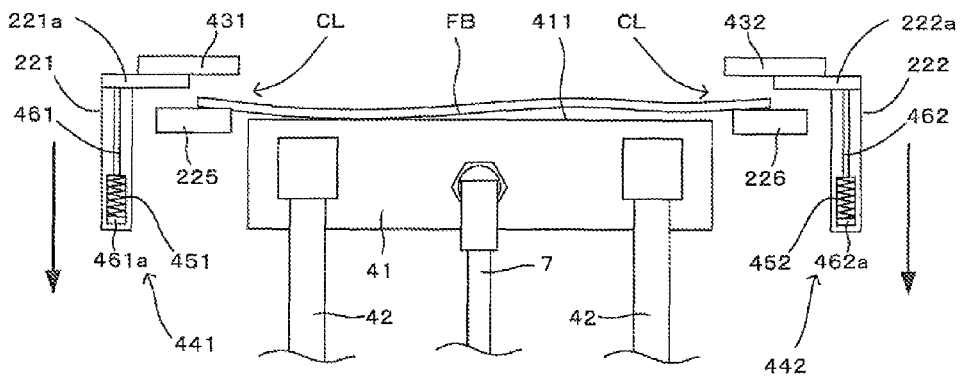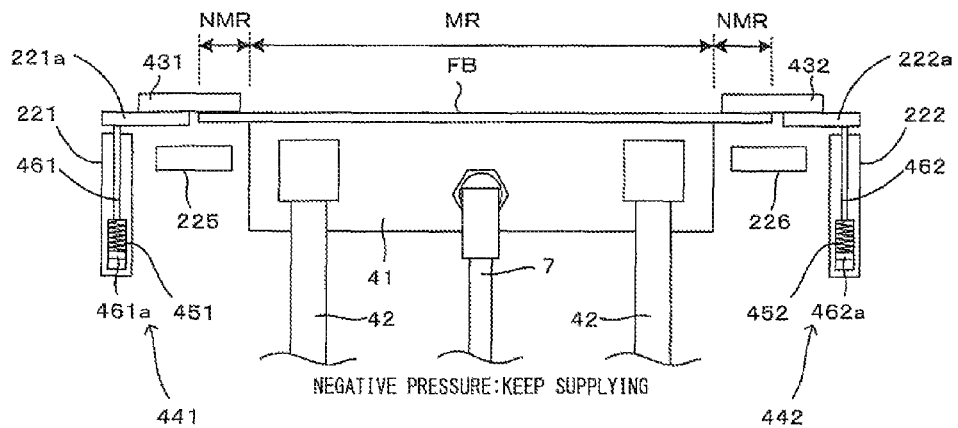

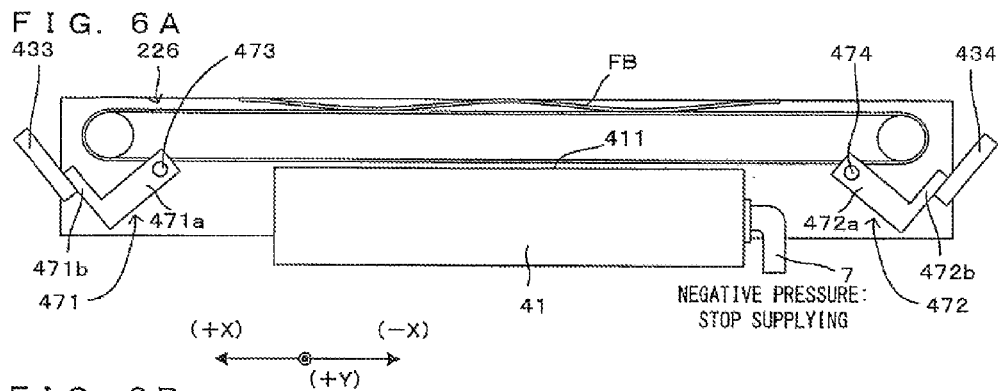
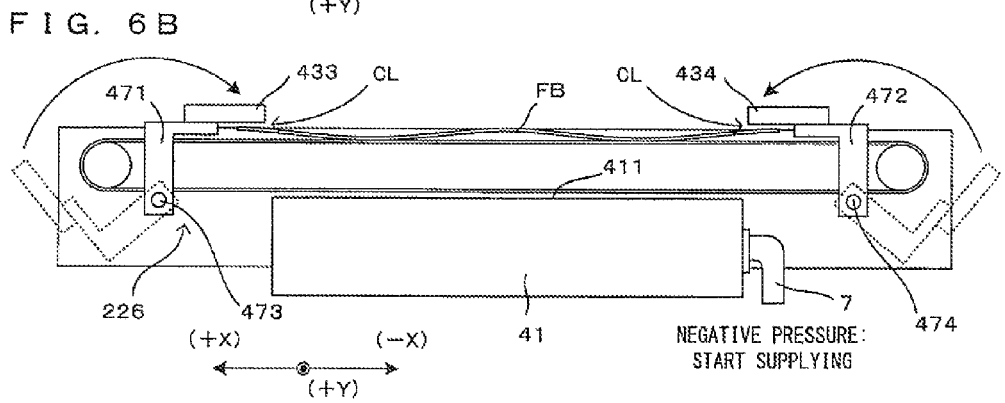
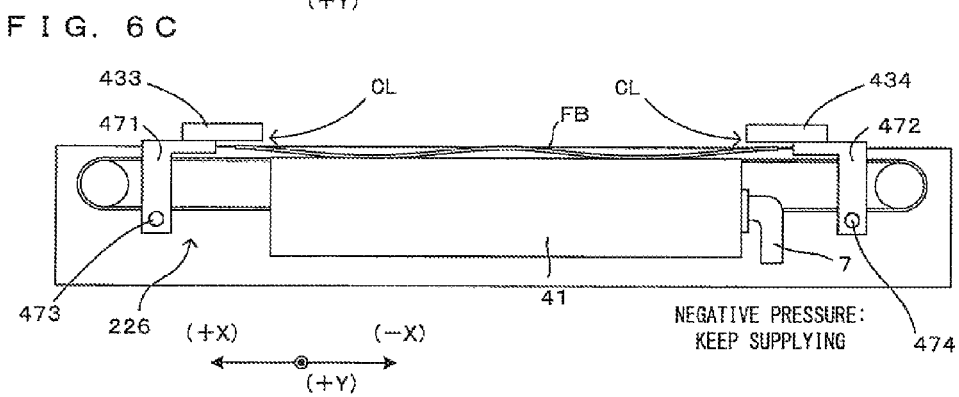
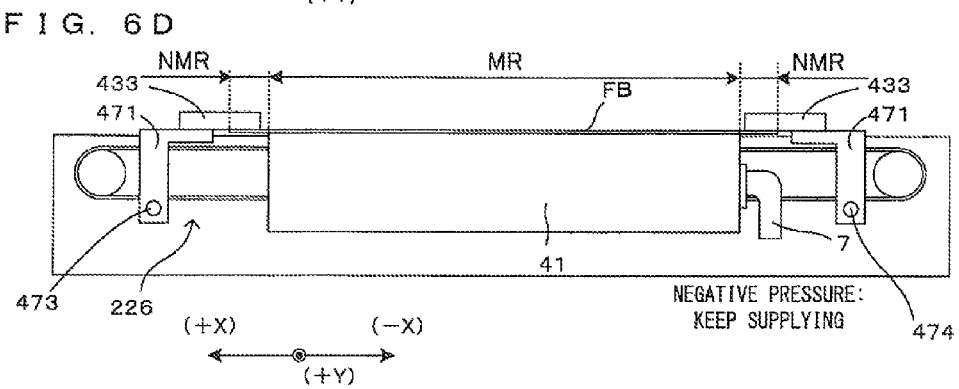

SUBSTRATE FIXING APPARATUS AND SUBSTRATE WORKING APPARATUS

CROSS REFERENCE TO RELATED APPLICATION

This application claims benefit of priority to Japanese Patent Application No. 2013-21307 filed Feb. 6, 2013, the entire content of which is incorporated herein by reference.

TECHNICAL FIELD

This technical field relates to a substrate fixing technique for supporting and fixing a film-like substrate by a back-up member at a working position, and a substrate working apparatus for performing a substrate operation such as the mounting of components, inspection, the application of application liquid or paste printing on a substrate fixed at a working position using the substrate fixing technique.

BACKGROUND

A film-like substrate (hereinafter, merely referred to as a "substrate") such as a flexible substrate is relatively thin and easily warped. Accordingly, there have been proposed numerous techniques for correcting the warpage of a substrate at a position where an operation such as the mounting of components is performed on the substrate, i.e. at a working position. For example, in the disclosure disclosed in JP2004-296632A, after a substrate is placed on a lower supporting surface of a lower supporting member, a pressing member is lowered and pressed into surface contact with the substrate from above to press the substrate against the lower supporting surface. In this way, a warpage of the substrate is corrected. The substrate is vacuum-sucked to the lower supporting surface by the operation of a vacuum suction unit in this state.

SUMMARY

The disclosure disclosed in JP2004-296632A is an apparatus for mounting components on a component mounting part of the substrate and aims to prevent the warpage of the substrate at the component mounting part. That is, the pressing member has a pressing surface of a size to entirely cover the range of the component mounting part of the substrate, the warpage is corrected by pressing only the component mounting part out of a substrate surface and the substrate is sucked by a suction groove connected to the vacuum suction unit. Thereafter, the pressing member is retracted from the substrate to mount the components. Thus, even if the substrate pressing member is pressed against the substrate surface to correct the warpage, an outer peripheral part of the substrate is warped when the substrate pressing member is retracted from the substrate surface and a suction force is reduced near the periphery of the substrate due to that warpage to further increase the warpage. Specifically, no consideration is made on warpage in a peripheral area of the component mounting part, i.e. in the outer peripheral part of the substrate.

Thus, if a fiducial mark is located on the substrate surface of the substrate peripheral part, which is outside the suction groove to be brought into contact from below, there have been cases where correct recognition cannot be made due to the warpage of that part, a substrate position and a substrate direction cannot be accurately detected and the components cannot be mounted at correct positions in a mounting machine. Further, in the case of installing the substrate fixing apparatus disclosed in JP2004-296632 in a printing machine or a substrate inspection machine, it is considered that printing cannot be made at a correct position in the printing machine and substrates cannot be accurately inspected in the substrate inspection machine. Particularly, in a substrate working apparatus in which conveying members such as a pair of conveyors are arranged at a distance from each other in a width direction of a substrate to convey the substrate to a working position while supporting each of lower end parts of the substrate in the width direction, a warpage in an outer peripheral part of the substrate tends to become large and it is a major technical problem to correct this warpage at the time of recognizing a fiducial mark.

This disclosure was developed in view of the above problem and aims to provide a technique for successfully correcting the warpage of an outer peripheral part of a film-like substrate in supporting and suction-fixing the substrate conveyed along a conveyance path while being supported from below by a pair of conveying members, and a substrate working apparatus for performing a substrate operation using this technique.

According to a first aspect of the disclosure, there is provided a substrate fixing apparatus comprising: a back-up member which is located between a pair of conveying members arranged at a distance from each other in a plan view from above and is below a film-like substrate conveyed along the conveyance path and supported from below by the pair of conveying members; and an elevation driver which moves at least one of the back-up member and the substrate pressing member upward and downward, wherein the elevation driver elevates the back-up member and/or lowers the substrate pressing member together with the pair of conveying members, thereby separating the substrate upward from the pair of conveying members while supporting the substrate from below by the back-up member and pressing the surface of the outer peripheral part of the substrate downward by the substrate pressing member to correct warpage of the outer peripheral part of the substrate.

According to a second aspect of the disclosure, there is provided a substrate working apparatus, comprising: a substrate conveying unit which conveys a film-like substrate along a conveyance path while supporting the substrate from below by a pair of conveying members arranged at a distance from each other; a substrate fixing unit configured to support and fix the substrate conveyed to an working position midway through the conveyance path by the substrate conveying unit; and a substrate working unit which performs a predetermined operation on a surface area of a surface of the substrate fixed by the substrate fixing unit excluding an area pressed by the substrate pressing member.

According to a third aspect of the disclosure, there is provided a substrate fixing method comprising: a supporting step of supporting a film-like substrate, conveyed along a conveyance path and supported from below by a pair of conveying members arranged at a distance from each other, and supporting the film-like substrate from below at a working position midway through the conveyance path by a back-up member located between the pair of conveying members instead of the pair of conveying members; and a correcting step of correcting warpage of an outer peripheral part of the substrate by pressing a surface of the outer peripheral part of the substrate supported by the back-up member by a substrate pressing member.

The above and further objects and novel features of the disclosure will more fully appear from the following detailed description when the same is read in connection

BRIEF DESCRIPTION OF THE DRAWINGS

FIG. 4A is a view showing a second embodiment of the substrate fixing apparatus according to the disclosure.

FIG. 4B is a view showing a second embodiment of the substrate fixing apparatus according to the disclosure.

FIG. 4C is a view showing a second embodiment of the substrate fixing apparatus according to the disclosure.

FIG. 6A is a view diagrammatically showing the operation of the substrate fixing unit.

FIG. 6B is a view diagrammatically showing the operation of the substrate fixing unit.

FIG. 6C is a view diagrammatically showing the operation of the substrate fixing unit.

FIG. 6D is a view diagrammatically showing the operation of the substrate fixing unit.

DETAILED DESCRIPTION

Figure 1:
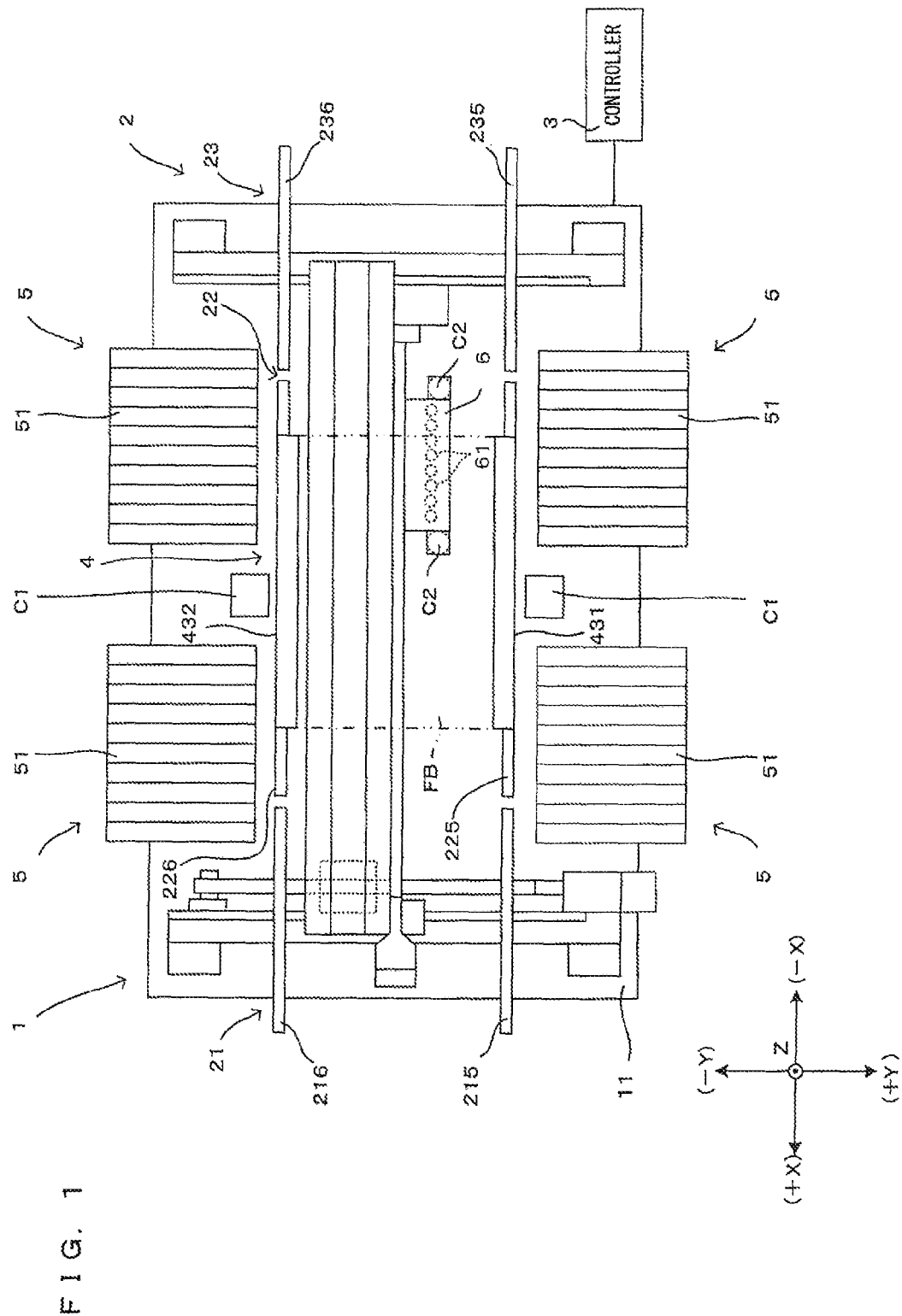
FIG. 1 is a plan view showing a schematic configuration of a substrate working apparatus equipped with a substrate fixing unit which is a first embodiment of a substrate fixing apparatus according to the disclosure.
Figure 2:
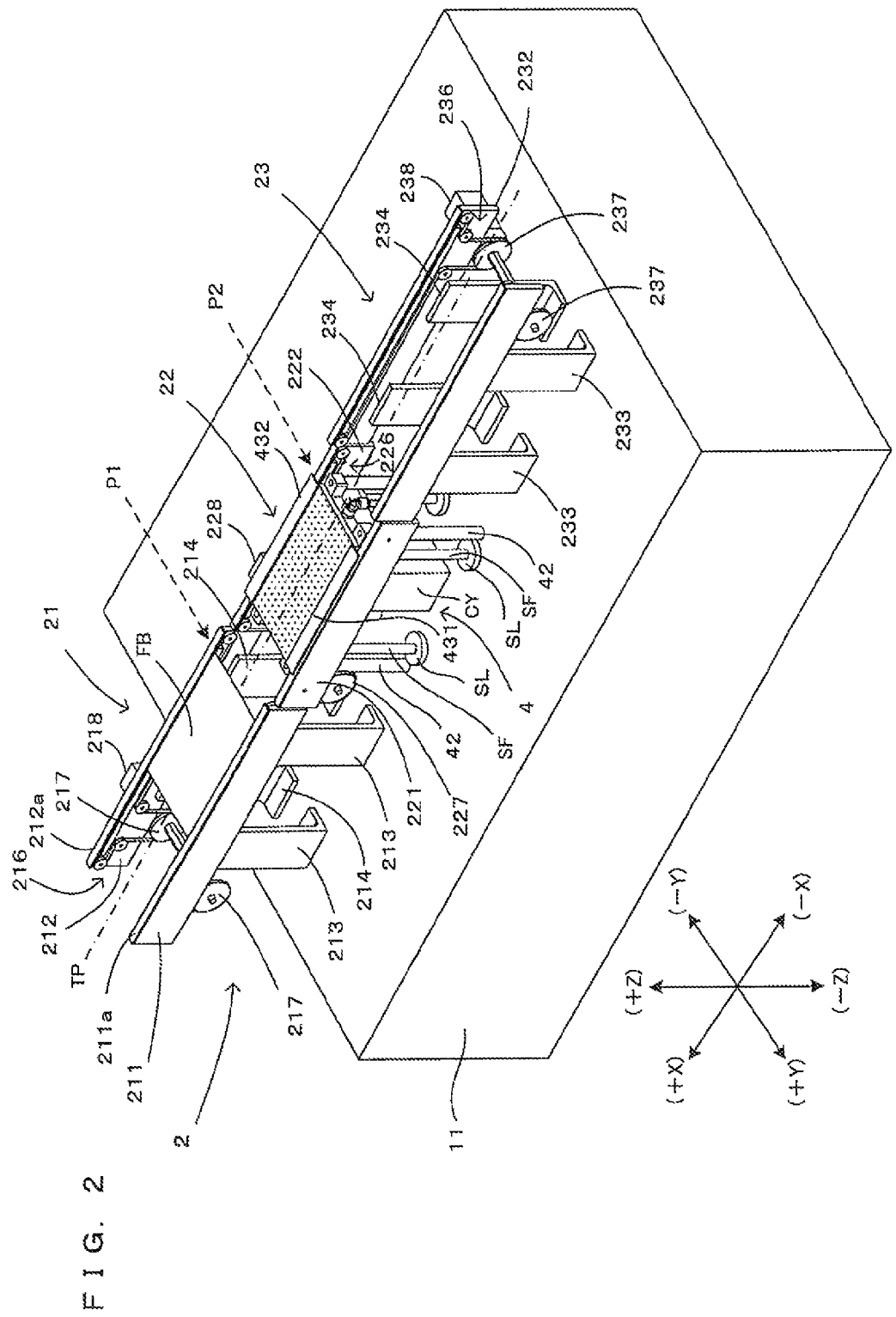
FIG. 2 is a partial perspective view showing the configurations of a substrate conveying unit and the substrate fixing unit in the substrate working apparatus.
Figure 3A:
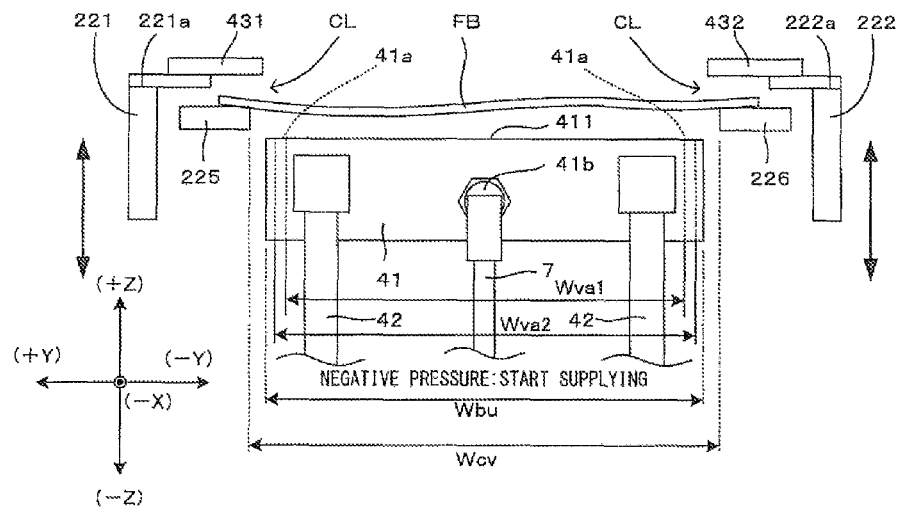
FIG. 3A is a view diagrammatically showing the operation of the substrate fixing unit.
Figure 3B:
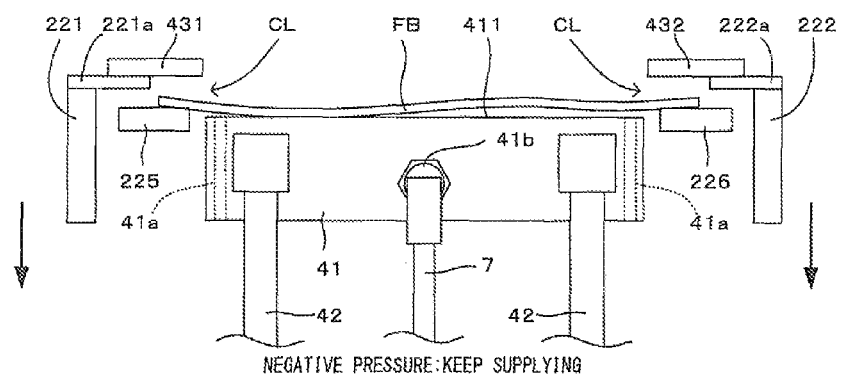
FIG. 3B is a view diagrammatically showing the operation of the substrate fixing unit.
Figure 3C:
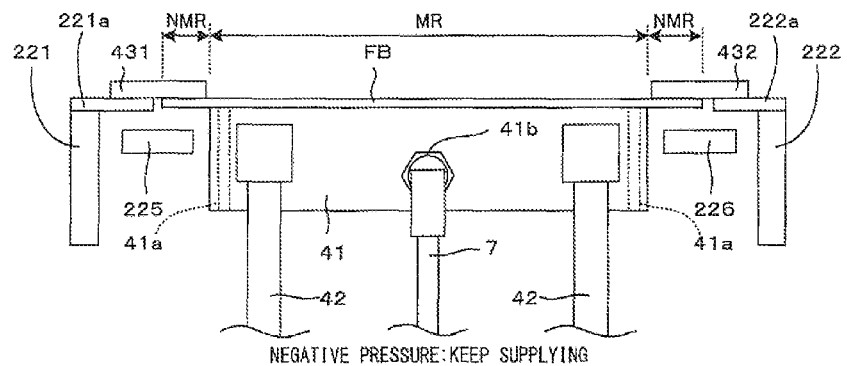
FIG. 3C is a view diagrammatically showing the operation of the substrate fixing unit.

FIG. 1 is a plan view showing a schematic configuration of a substrate working apparatus equipped with a substrate fixing unit which is a first embodiment of a substrate fixing apparatus according to the disclosure. FIG. 2 is a partial perspective view showing the configurations of a substrate conveying unit and the substrate fixing unit in the substrate working apparatus. FIGS. 3A, 3B and 3C are views diagrammatically showing the operation of the substrate fixing unit. Note that XYZ orthogonal coordinate axes are shown in these figures and each figure to be described later to clarify a directional relationship of each figure.

The substrate working apparatus shown in FIG. 1 is a surface mounting machine 1 for mounting components on a film-like substrate FB. In the surface mounting machine 1, a substrate conveying unit 2 is arranged on a base 11 and capable of conveying the substrate FB in a conveying direction X. In the substrate conveying unit 2 of this embodiment, a loading mechanism 21, a main conveying mechanism 22 and an unloading mechanism 23 are arranged in a row from an upstream side (left side of FIGS. 1 and 2) toward a downstream side (right side of FIGS. 1 and 2) in the conveying direction X so that the substrate FB can be conveyed along a conveyance path TP from the left side to the right side of FIGS. 1 and 2. A drive motor (not shown) is coupled to each of the loading mechanism 21, main conveying mechanism 22 and unloading mechanism 23 and drive-controlled by a controller 3 for controlling the entire surface mounting machine 1. By this, the substrate FB stopped at a substrate stopping position P1 of the loading mechanism 21 is conveyed along the conveyance path TP toward a working position P2 as shown in FIG. 2. At this working position P2, a substrate fixing unit 4 is provided to support and fix the substrate FB conveyed thereto. Components stored in component storage units 5 are mounted on the substrate FB by a head unit 6. When the mounting of the components on the substrate FB is completed, the substrate FB is released from a s fixed state by the substrate fixing unit 4 and the substrate FB having the component mounted thereon is unloaded by the main conveying mechanism 22 and the unloading mechanism 23. Note that, in this specification, the position of the substrate FB is specified based on the tip position of the substrate FB. Further, the configurations and operations of the substrate conveying unit 2 and the substrate fixing unit 4 are described in detail later.

The component storage units 5 are arranged on opposite sides of the substrate conveying unit 2 in a Y-axis direction and one or plural more tape feeders 51 are detachably attached to each of these component storage units 5. In the component storage unit 5, a reel (not shown) on which a tape accommodating and holding electronic components at fixed pitches is arranged in correspondence with each feeder 51 to enable the supply of the electronic components by each feeder 51.

The head unit 6 is configured to be movable in an X-axis direction and the Y-axis direction above the base 11 over a predetermined range of the base 11. Further, in this embodiment, in the head unit 6, eight unillustrated mounting heads extending in a vertical direction Z are arranged at equal intervals in a row in the X-axis direction (conveying direction of the substrate FB by the substrate conveying unit 2), and a suction nozzle 61 is attached to a tip part of each mounting head. Each mounting head is movable upward and downward (movements in a Z-axis direction) relative to the head unit 6 by a nozzle elevation driving mechanism using a Z-axis motor (not shown) as a drive source and rotatable about a nozzle center axis by a nozzle rotation driving mechanism using an R-axis motor (not shown) as a drive source. Out of these driving mechanisms, the nozzle elevation driving mechanism is for moving the mounting head upward and downward between a lower position where suction or mounting is performed and an upper position where conveyance and imaging are performed. On the other hand, the nozzle rotation driving mechanism is a mechanism for rotating the component suction nozzle according to need such as to align the component suction nozzle in a mounting direction of the electronic component and correct a suction deviation in an R-axis direction, and can locate the electronic component in the predetermined R-axis direction at the time of mounting the electronic component by the rotational drive.

The thus configured head unit 6 sucks and holds the electronic components supplied from the feeders 51 by the suction nozzles 61 after being moved to a position above the component storage unit 5. Further, by a movement of this head unit 6, the electronic components sucked by the suction nozzles 61 are conveyed from the position above the component storage unit 5 to a position above the substrate FB and mounted on the substrate FB.

Note that, during the conveyance, the head unit 6 passes above a component recognition camera C1 arranged in the middle in the X-axis direction between two component storage units 5 at each of opposite sides of the conveyance path TP. At this time, the component recognition camera C1 images the electronic components sucked by the respective suction nozzles 61 from below. Then, a suction deviation in each suction nozzle 61 is detected from an imaging result and a position correction appropriate for the suction deviation is made when each electronic component is mounted on the substrate FB.

Further, a substrate recognition camera C2 is fixed to each of opposite side parts of the head unit 6 in the X-axis direction and can image the substrate FB from above at an arbitrary position by movements of the head unit 6 in the X-axis direction and the Y-axis direction. Thus, each substrate recognition camera C2 images a plurality of fiducial marks attached to an outer peripheral part of the substrate FB located on the working position and image-recognizes a substrate position and a substrate direction before the components are mounted. In mounting the components on the substrate FB, component mounting positions set on the substrate FB are corrected based on the image-recognized substrate position and substrate direction, thereby enabling mounting at correct positions.

Next, the configurations of the substrate conveying unit 2 and the substrate fixing unit 4 are described in detail with reference to FIGS. 1 to 3. Out of three mechanisms constituting the substrate conveying unit 2, the loading mechanism 21 and the unloading mechanism 23 have the same configuration. Here, the configuration of the loading mechanism 21 is described and that of the unloading mechanism 23 is denoted by corresponding reference signs and not described.

In the loading mechanism 21, two conveyor frames 211, 212 extending in the conveying direction X are arranged on opposite sides of the conveyance path TP at positions above the base 11 while being spaced apart by a distance slightly longer than a dimension of the substrate FB in the Y-axis direction (i.e. substrate width). The (+Y) side conveyor frame 211 is supported on upper end parts of two supporting members 213, 213 standing on the upper surface of the base 11 and the (−Y) side conveyor frame 212 is supported on upper end parts of two supporting members 214, 214 standing on the upper surface of the base 11. In this way, the conveyor frames 211, 212 are fixedly arranged at positions at a predetermined distance from and above (+Z) the base 11. Note that, as shown in FIG. 2, a roof-like member 211a, 212a protruding toward a conveyor 216, 215 is provided on the upper end of each conveyor frame 211, 212.

As shown in FIG. 2, the (−Y) side conveyor 216 is attached to a (+Y) side surface of the (−Y) side conveyor frame 212. This conveyor 216 is formed by an endless conveyor belt mounted on a plurality of pulleys arranged in the conveying direction X and can support a (−Y) side end part of the lower surface of the substrate FB. Further, the (+Y) side conveyor 215 configured similarly to the (−Y) side conveyor 216 is also attached to a (−Y) side surface of the (+Y) side conveyor frame 211 and can support a (+Y) side end part of the lower surface of the substrate FB. In this way, the substrate FB is supported on both sides by the pair of conveyors 215, 216.

Each of the conveyor belts of these conveyors 215, 216 is engaged with a drive transmission pulley 217. When a rotational drive force generated in a conveyor drive motor 218 is transmitted to the drive transmission pulleys 217, the both conveyor belts rotate in synchronization. By this, at a certain height position from the base 11, the conveyor belts of the conveyors 215, 216 convey the substrate FB along the conveyance path TP while supporting it from below.

Further, although not shown, a sensor for detecting the substrate FB being conveyed is fixedly arranged at a position below the conveyors 215, 216 on a (+X) side. This sensor outputs a substrate detection signal to the controller 3 when detecting the substrate FB being conveyed in the conveying direction X by the conveyors 215, 216. Then, the controller 3 controls the drive motor for the loading conveyors 215, 216 after the substrate FB is detected by the above sensor, conveys the substrate FB only a certain distance and stops the substrate FB at the substrate stopping position P1 at a predetermined distance from the sensor in the conveying direction X as shown in FIG. 1.

On the other hand, similarly to the loading mechanism 21 and the unloading mechanism 23, the main conveying mechanism 22 includes two conveyor frames 221, 222, a conveyor belt 225 is attached to the (+Y) side conveyor frame 221 and a conveyor belt 226 is attached to the (−Y) side conveyor frame 222. However, in the main conveying mechanism 22, the conveyor frames 221, 222 and the conveyors 225, 226 are integrally movable upward and downward in the vertical direction Z as described next. Thus, the following description is centered on points of difference and the same configuration as the loading mechanism 21 is denoted by corresponding reference signs and not described.

In the main conveying mechanism 22, sleeves SL of two cylindrical guides are fixed to the upper surface of the base 11 in a row between the (+Y) side supporting member 213 of the loading mechanism 21 and a (+Y) side supporting member 233 of the unloading mechanism 23, and two sleeves SL (only one is shown in FIG. 2) are fixed thereto in a row between the (−Y) side supporting member 214 of the loading mechanism 21 and a (−Y) side supporting member 234 of the unloading mechanism 23. Further, as shown in FIG. 2, shafts SF stand while penetrating through the respective (+) side sleeves SL, SL and the (+Y) side conveyor frame 221 is fixed to an upper end part of each shaft SF. The (−Y) side is similarly configured. A total of four shafts SF guide the conveyor frames 221, 222 and the conveyors 225, 226 integrally in the Z-axis direction (vertical direction) while sliding on the respective sleeves SL. Further, as a drive source for integrally moving these conveyor frames 221, 222 and the conveyors 225, 226 upward and downward, a cylinder CY is fixedly arranged on the upper surface of the base 11. That is, a coupling member (not shown) is arranged while being spaced apart from a back-up member 41 of the substrate fixing unit 4 to be described next toward a lower (−Z) side to couple the conveyor frames 21, 222 to each other. Further, the coupling member is connected to a piston tip part of the cylinder CY. Thus, when the cylinder CY advances the piston upward (+Z) in response to a command to extend from the controller 3, the conveyor frames 221, 222 move upward according to that advancing movement and the conveyors 225, 226 are located at the same height position as the conveyors 215, 216 on the loading mechanism side and the conveyors 235, 236 on the unloading mechanism side (height position higher than an upper surface (substrate suction surface) 411 of the back-up member 41). Conversely, when the cylinder CY retracts the piston downward (−Z) in response to a command to contract, the conveyor frames 221, 222 are lowered according to that contracting movement and the conveyors 225, 226 are located at a position lower than the upper surface (substrate suction surface) 411 of the back-up member 41.

Next, the operation of the surface mounting machine 1 is described after the configuration of the substrate fixing unit 4 is described. This substrate fixing unit 4 includes the back-up member 41, four support columns 42 for supporting the back-up member 41 and two substrate pressing members 431, 432. The back-up member 41 is formed of a suction plate with a plurality of suction holes 41a perforated on an upper surface. The upper surface of this back-up member 41 has a rectangular shape and a length thereof in the X-axis direction is substantially equal to the substrate FB, whereas a length (plate width) Wbu thereof in the Y-axis direction is slightly shorter than an inner dimension Wcv between the conveyors 225, 226 as shown in FIG. 3A. The back-up member 41 is arranged to be located between the pair of conveyors 225, 226 at the working position P2 in a plan view from above. Further, upper end parts of two support columns 42 standing on the upper surface of the base 11 are connected to each of an upstream (+X) end surface and a downstream (−X) end surface of the back-up member 41. In this way, the back-up member 41 is fixed to the base 11 by a total of four columns 42 in a state where the upper surface (suction surface) 411 is located at a position lower than the conveyance path TP for conveying the substrate FB by the substrate conveying unit 2.

Further, a negative pressure introducing plug 41b communicating with the plurality of suction holes 41a in the back-up member 41 is provided on the downstream (−X) end surface of the back-up member 41 and one end of a negative pressure supply pipe 7 is connected to this negative pressure introducing plug 41b. The other end of the negative pressure supply pipe 7 is connected to an unillustrated negative pressure supply source such as a vacuum pump. The controller 3 controls the supply of a negative pressure to the plurality of suction holes 41a of the back-up member 41 and the stop of the supply, whereby the substrate FB is sucked and fixed by the back-up member 41 and released from a sucked state.

If Wva1 is defined to denote a distance in the Y-axis direction between the inner sides of the suction holes 41a on opposite ends in the Y-direction out of the plurality of suction holes 41a and Wva2 is defined to denote a distance in the Y-axis direction between the outer sides of the suction holes 41a on the opposite ends in the Y-direction, the following can be known. Specifically, warpage cannot be corrected not only on the outer periphery of the substrate FB located outside an area of the distance Wva2 in the Y-axis direction between the inner sides of the suction holes 41a on the opposite ends in the Y-direction, but also the outer periphery of the substrate FB located outside an area of the distance Wva1 in the Y-axis direction between the inner sides of the suction holes 41a on the opposite ends in the Y-direction even in a state where the negative pressure is supplied to the plurality of suction holes 41a and the substrate FB is sucked and fixed to the back-up member 41.

In this embodiment, the substrate fixing unit 4 includes the two substrate pressing members 431, 432 to correct the warpage of end parts of the substrate FB in the Y-direction. Out of these, the (+Y) side substrate pressing member 431 is fixed to project toward a space above a (+Y) side end part of the back-up member 41 from the roof-like member 221a on the top of the conveyor frame 221 as shown in FIG. 3. Thus, a clearance CL is formed between the substrate pressing member 431 and the (+Y) side conveyor 225. In this embodiment, this clearance CL is set to exceed a sum of a thickness and a warpage amount of the substrate FB to correct the warpage of an outer peripheral part of the substrate FB as described later. Note that the "warpage amount of the substrate FB" is preferably set at a maximum value of an estimated warpage amount of the substrate FB.

The other substrate pressing member 432, i.e. the one on the (−Y) side is configured symmetrically with the (+Y) side substrate pressing member 431 with the back-up member 41 located therebetween. Specifically, the substrate pressing member 432 is fixed to project toward a space above a (−Y) side end part of the back-up member 41 from the roof-like member 222a on the top of the conveyor frame 222. Note that a clearance CL between the substrate pressing member 432 and the (−Y) side conveyor 226 is also preferably set at the same value as on the (+Y) side.

Next, the operation of the surface mounting machine 1 configured as described above is described with reference to FIGS. 2, 3A, 3B and 3C. In the surface mounting machine 1, the controller 3 waits until a preparation to start the mounting of components on the unprocessed substrate FB is completed in a state where this substrate FB is stopped at the substrate stopping position P1 as shown in FIG. 2. Then, when the mounting of the components on the substrate FB on standby becomes possible, the controller 3 controls the loading mechanism 21 and the main conveying mechanism 22 in accordance with a mounting program to convey and position the substrate FB to the working position P2. At this time, the conveyor frames 221, 222 are elevated to an uppermost position as shown in FIG. 3A, whereby the conveyors 225, 226 attached to the conveyor frames 221, 222 are located at the same height position as the conveyors 215, 216 on the loading mechanism side and the conveyors 235, 236 on the unloading mechanism side and the upper surfaces of the conveyors 225, 226, i.e. supporting surfaces for supporting substrate FB are flush with the conveyance path TP. Further, at this time, each substrate pressing member 431, 432 is separated upward from the conveyance path TP by the predetermined clearance CL. Thus, even if outer peripheral parts of the substrate FB in the Y-axis direction are warped, the substrate FB can be smoothly conveyed from the loading mechanism 21 to the main conveying mechanism 22.

The substrate FB conveyed to the working position P2 is located right above the back-up member 41 and the controller 3 starts supplying the negative pressure to the back-up member 41 in this state. Simultaneously with or subsequent to this, the controller 3 retracts the piston downward (−Z) to integrally lower the conveyor frames 221, 222 and the substrate pressing members 431, 432. After a part of the substrate FB comes into contact with the upper surface 411 of the back-up member 41 to be sucked as shown in FIG. 3B during this lowering movement, an area to be sucked and held spreads over the entire upper surface 411 according to a further lowering movement. Further, when the conveyors 225, 226 are moved to a position lower than the upper surface (substrate suction surface) 411 of the back-up member 41 as shown in FIG. 3C, the conveyors 225, 226 are isolated downward from the substrate FB (i.e. the substrate FB is separated upward from the pair of conveyors 225, 226). At this time, out of the substrate FB, the entire lower surface of a mounting region MR where components are to be mounted is sucked and fixed to the upper surface 411 of the back-up member 41.

While the mounting region MR is sucked and held, warpage in non-mounting regions NMR of the substrate FB excluding the mounting region MR is corrected by the substrate pressing members 431, 432. Specifically, the (+Y) side substrate pressing member 431 comes into contact with the (+Y) side non-mounting region NMR warped upward and then further presses this region downward while being lowered together with the conveyor frame 221. This causes all the pressing forces by the substrate pressing members 431 to be transmitted to the back-up member via the substrate FB, whereby the warpage in the (+Y) side non-mounting region NMR is corrected as shown in FIG. 3C.

Further, the (−Y) side substrate pressing member 432 also corrects the warpage in the (−Y) side non-mounting region NMR in the same manner as the (+Y) side substrate pressing member 431.

When the fixing and correction of the substrate FB are completed, the controller 3 controls each part of the apparatus in a state where the non-mounting regions NMR are pressed to correct the warpage by the substrate pressing members 431, 432. More specifically, the surface mounting machine 1 image-recognizes the fiducial marks attached to the outer periphery of the substrate FB outside the area of the distance Wva1 in the Y-axis direction between the inner sides of the suction holes 41*a* on the opposite ends in the Y-direction and mounts the components on the surface of the mounting region MR including the outer periphery of the substrate FB located outside of the area of the distance Wva1 in the Y-axis direction between the inner side of the suction holes 41*a* on the opposite ends in the Y-direction. Further, when the mounting of the components is completed, the controller 3 stops supplying the negative pressure to the back-up member 41 and releases negative pressure supply paths to the suction holes 41*a* of the back-up member 41 to atmosphere. Thereafter, the controller 3 advances the piston upward (+Z) to integrally elevate the conveyor frames 221, 222 and the substrate pressing members 431, 432. In this way, the substrate pressing members 431, 432 having pressed the non-mounting regions NMR are slowly separated upward from the non-mounting regions NMR and the substrate FB having the components mounted is transferred from the back-up member 41 onto the conveyors 225, 226.

When the transfer of the substrate from the back-up member 41 to the conveyors 225, 226 is completed, the controller 3 controls the main conveying mechanism 22 and the unloading mechanism 23 to unload the substrate FB from the surface mounting machine 1.

As described above, according to this embodiment, the fixing of the substrate FB and the correction of the warpage of the non-mounting regions NMR of the substrate FB by the back-up member 41 can be successfully performed since the upper surfaces of the non-mounting regions NMR of the substrate FB are pressed downward by the substrate pressing members 431, 432 with the substrate FB supported from below by the back-up member 41 at the working position P2. Further, in this embodiment, the lower surface of the area of the distance Wva2 in the Y-axis direction between the outer sides of the suction holes 41*a* on the opposite sides in the Y-direction, which area is located inside the mounting region MR of the substrate FB, is sucked and held by a suction force, and the warpage of the mounting region MR outside the area of the distance Wva2 in the Y-axis direction between the outer sides of the suction holes 41*a* on the opposite sides in the Y-direction and the non-mounting regions NMR located outside the mounting region MR becomes a main factor causing a reduction in the suction force. However, in this embodiment, the substrate fixing unit 4 includes the two substrate pressing members 431, 432 as described above and can reliably correct the warpage outside the area of the distance Wva2 in the Y-axis direction between the outer sides of the suction holes 41*a* on the opposite sides in the Y-direction and in the non-mounting regions NMR. Thus, the substrate FB can be reliably and stably fixed by the back-up member 41. In addition, even if a plurality of fiducial marks attached to the outer peripheral part of the substrate FB are located outside the area of the distance Wva2 in the Y-axis direction between the outer sides of the suction holes 41*a* on the opposite sides in the Y-direction, the plurality of fiducial marks are imaged and the substrate position and the substrate direction are detected by image recognition while the correction process is performed by the substrate pressing members 431, 432. In mounting the components on the substrate FB, the component mounting positions set on the substrate FB in advance are corrected based on the detected substrate position and substrate direction, whereby the components can be mounted at correct positions.

Also when being mounted in the mounting region MR outside the area of the distance Wva1 in the Y-axis direction between the inner sides of the suction holes 41*a* on the opposite sides in the Y-direction, the components are mounted on the flat substrate FB free from warpage by performing the correction process by the substrate pressing members 431, 432. Thus, the components can be correctly mounted at the component mounting positions set on the substrate FB in advance.

Further, the (+Y) side sleeves SL and shafts SF and the cylinder CY are arranged outside the back-up member 41 in the Y-direction and easily inspected from the (+Y) side without the back-up member 41 becoming an obstacle, and maintenance management is facilitated. Similarly, the (−Y) side sleeves SL and shafts SF are arranged outside the back-up member 41 in the Y-direction and easily inspected from the (−Y) side without the back-up member 41 becoming an obstacle, and maintenance management is facilitated. Note that a plurality of sleeves SL, shafts SF and the cylinder CY correspond to an example of an "elevation driver" of the disclosure.

FIGS. 4A, 4B and 4C are views showing a second embodiment of the substrate fixing apparatus according to the disclosure. This second embodiment differs from the first embodiment in that shock absorbing members are added and the other configuration is the same as in the first embodiment. Accordingly, the following description is centered on points of difference and the same configuration is denoted by the same reference signs and not described.

Although the substrate pressing members 431, 432 are respectively directly attached to the conveyor frames 221, 222 in the first embodiment, they are attached to conveyor frames 221, 222 via shock absorbing members 441, 442 in the second embodiment. Specifically, the (+Y) side conveyor frame 221 includes a recess into which the (+Y) side shock absorbing member 441 is to be inserted and which is open in the (+Z) direction. This shock absorbing member 441 is formed of a compression coil spring 451 and a shaft 461. A spring receiver 461*a* is provided on the lower end of the shaft 461 and an external thread is formed on an upper end part. In a state where the compression coil spring 451 is received by the spring receiver 461*a*, the compression coil spring 451 and the shaft 461 are inserted into the recess through the opening and the upper end part of the shaft 461 is coupled by being screwed into a roof-like member 221*a* of the frame 221. This causes the upper end part of the shaft 461 to be connected to a (+Y) side substrate pressing member 431. Thus, the (+Y) side substrate pressing member 431 is coupled to the conveyor frame 221 movably in the vertical direction Z while receiving a biasing force of the compression coil spring 451. Note that an opening of the recess in the (−Z) direction is closed by a lid member.

On the other hand, the (−Y) side shock absorbing member 442 is also configured similarly to the (+Y) side shock absorbing member 441. Specifically, in a state where a compression coil spring 452 is received by a spring receiver 462*a*, the compression coil spring 452 and a shaft 462 are inserted into a recess provided on the (−Y) side conveyor frame 222 and, further, an upper end part of the shaft 462 is connected to the (−Y) side substrate pressing member 432 by being screwed into a roof-like member 222a of the frame 222. Thus, the (−Y) side substrate pressing member 432 is coupled to the conveyor frame 222 movably in the vertical direction Z while receiving a biasing force of the compression coil spring 452.

Also in the thus configured second embodiment, non-mounting regions NMR are pressed by the substrate pressing members 431, 432 and released from a pressed state in the same manner as in the first embodiment. The following functions and effects are obtained by adding the shock absorbing members 441, 442. Specifically, in performing a warpage correction process, pressing forces applied to the non-mounting regions NMR are kept at a constant value after moderately increasing in an initial stage of contact of the substrate pressing members 431, 432 with the non-mounting regions NMR. Conversely, in separating the substrate pressing members 431, 432 from the non-mounting regions NMR after components are mounted, the above pressing forces moderately decrease. Thus, the pressing forces exhibited at the time of correcting warpage can be stabilized. Further, also in separating the substrate pressing members 431, 432 from the non-mounting regions NMR of the substrate FB, a sudden change of the above pressing force can be suppressed and a shock acting on the substrate FB can be alleviated during this separating operation. As a result, displacements of the mounted components can be more effectively prevented.

Figure 5:
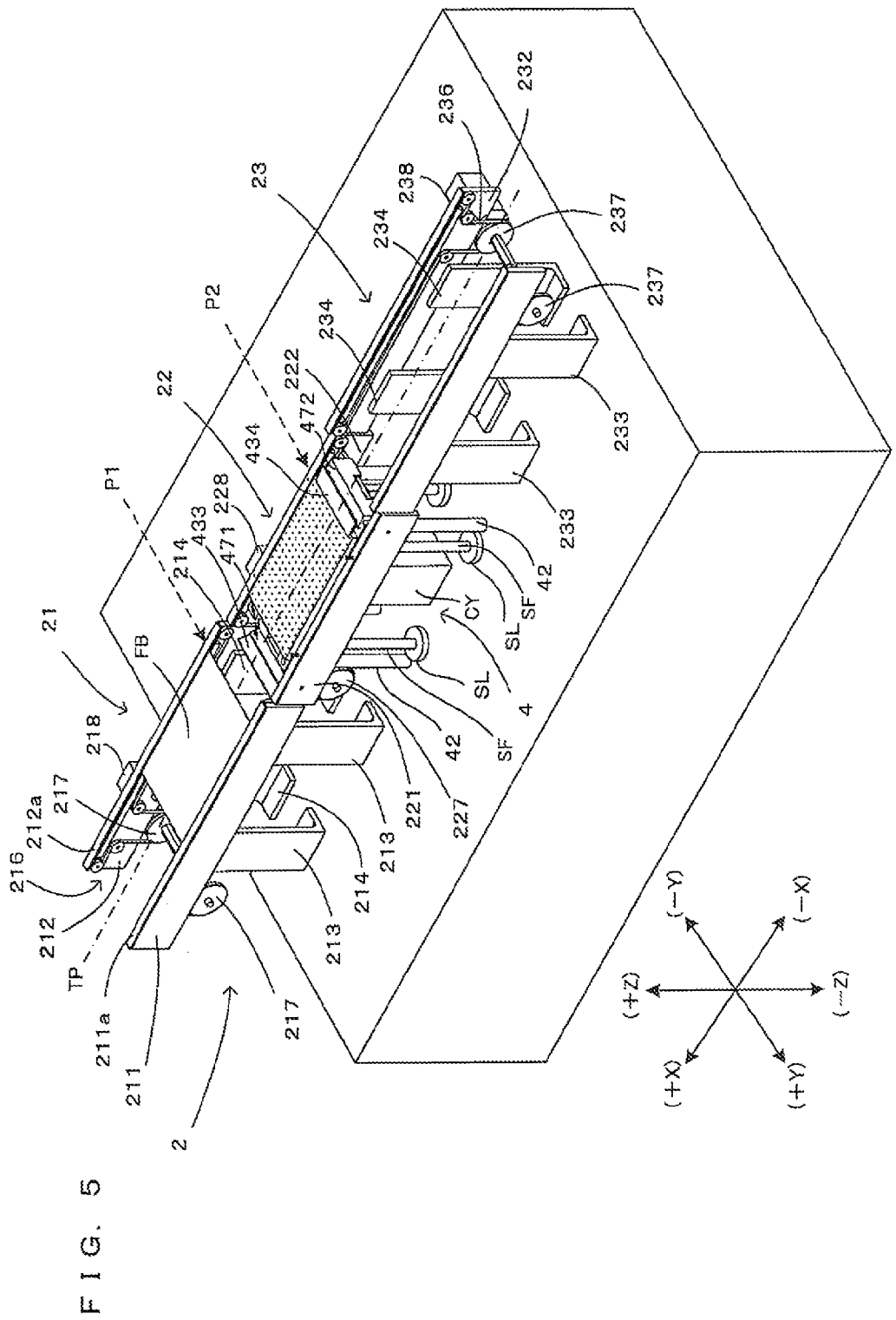
FIG. 5 is a partial perspective view of a substrate working apparatus equipped with a substrate fixing unit which is a third embodiment of the substrate fixing apparatus according to the disclosure showing the substrate fixing unit and a substrate conveying unit of this substrate working apparatus.

FIG. 5 is a partial perspective view of a substrate working apparatus equipped with a substrate fixing unit which is a third embodiment of the substrate fixing apparatus according to the disclosure showing the substrate fixing unit and a substrate conveying unit of this substrate working apparatus. FIGS. 6A, 6B, 6C and 6D are views diagrammatically showing the operation of the substrate fixing unit. Note that XYZ orthogonal coordinate axes are shown in these figures to clarify a directional relationship of each figure.

The substrate working apparatus shown in FIG. 5 is a surface mounting machine 1 for mounting components in a mounting region MR (FIG. 6D) of a substrate FB in the same manner as the substrate working apparatus shown in FIG. 1 and basically has the same configuration as in the first embodiment except the substrate fixing unit. Accordingly, the following description is centered on points of difference and the same configuration is denoted by the same reference signs and not described.

A substrate fixing unit 4 according to this embodiment includes a back-up member 41, four support columns 42 for supporting the back-up member 41, two substrate pressing members 433, 434, two movable members 471, 472 and a switching driver (not shown). The back-up member 41 is configured similarly to that of the first embodiment except in that a length thereof in the X-axis direction is slightly shorter than a length (so-called substrate length) of the substrate FB in the X-axis direction. Specifically, the back-up member 41 is formed of a suction plate with a plurality of suction holes 41a perforated on an upper surface and arranged to be located between a pair of conveyors 225, 226 at a working position P2 in a plan view from above. This back-up member 41 is fixed to a base 11 by the four support columns 42 in a state where the upper surface (suction surface) 411 is located at a position lower than a conveyance path TP for conveying the substrate FB by a substrate conveying unit 2. One end of a negative pressure supply pipe 7 is connected to a downstream (−X) side end surface of the back-up member 41. The other end of this negative pressure supply pipe 7 is connected to an unillustrated negative pressure supply source such as a vacuum pump. A controller 3 controls the supply of a negative pressure to the back-up member 41 and the stop of the supply, whereby the substrate FB is sucked and fixed by the back-up member 41 and released from a sucked state.

Also in the third embodiment, the warpage of the substrate FB is corrected by the two substrate pressing members 433, 434. As described later, the substrate pressing members 433, 434 are configured as follows to respectively perform a correction process by pressing a (+X) side end part and a (−X) side end part of the substrate FB. The movable member 471 extending in the Y-axis direction is arranged adjacent to the back-up member 41 between the conveyor frames 221, 222 on an upstream side, i.e. an (+X) side of the back-up member 41. This movable member 471 has a substantially L-shaped cross section on a plane (XZ plane) as shown in FIG. 6A, and one end part 471a is rotatably supported on a support shaft 473, the both ends of which are fixed to the conveyor frames 221, 222. The movable member 471 is rotated by a drive force applied from the unillustrated switching driver such as a cylinder or a motor, thereby switching the position of another end part 471b between a position (see FIG. 6A) lower than the conveyors 225, 226 and a position (see FIGS. 6B, 6C and 6D) higher than the conveyors 225, 226.

The substrate pressing member 433 is attached to the other end part 471b of the movable member 471. When the other end part 471b of the movable member 471 is switched to the position lower than the conveyors 225, 226 by the switching driver, the substrate pressing member 433 is positioned together with the movable member 471 to a retracted position which is lower than the conveyance path TP and where there is no interference with the substrate FB as shown in FIG. 6A. On the other hand, when the other end part 471b of the movable member 471 is switched to the position higher than the conveyors 225, 226 by the switching driver, the substrate pressing member 433 is positioned together with the movable member 471 to be higher than the conveyors 225, 226 and project from the movable member 471 toward a space above a (+Y) side end part of the back-up member 41 as shown in FIG. 6B.

On the other hand, the movable member 472 and the substrate pressing member 434 are arranged symmetrically with the movable member 471 and the substrate pressing member 433 with the back-up member 41 located therebetween on a downstream side, i.e. a (−X) side of the back-up member 41. Specifically, the movable member 472 having a substantially L-shaped cross-section in the XZ plane is arranged adjacent to the (−X) side of the back-up member 41 between the conveyor frames 221, 222 and rotatably supported on a support shaft 474, the both ends of which are fixed to the conveyor frames 221, 222. The movable member 472 is rotated by a drive force applied from the unillustrated switching driver, thereby switching the position of another end part 472b between a position (see FIG. 6A) lower than the conveyors 225, 226 and a position (see FIGS. 6B, 6C and 6D) higher than the conveyors 225, 226. Further, the substrate pressing member 434 is attached to the other end part 472b of the movable member 472 and switched between a retracted position distant from the conveyance path TP and a position above the conveyors 225, 226 similarly to the (+X) side movable member 471.

Next, the operation of the surface mounting machine 1 configured as described above is described with reference to FIGS. 5, 6A, 6B, 6C and 6D. In the surface mounting machine 1, the controller 3 controls a loading mechanism 21 and a main conveying mechanism 22 in accordance with a mounting program to convey and position the substrate FB to the working position P2 when the mounting of components on the substrate FB on standby becomes possible at a substrate stopping position P1 as shown in FIG. 5 in the same manner as in the first embodiment. In this third embodiment, the substrate FB is so positioned at the working position P2 that the (+X) side end part of the substrate FB are located more toward the (+X) side than the back-up member 41 and the (−X) side end part is located more toward the (−X) side than the back-up member 41 as shown in FIG. 6A. The movable members 471, 472 and the substrate pressing members 433, 434 are retracted to the retracted positions distant from the conveyance path TP to avoid interference with the substrate FB while the substrate FB is conveyed to the working position P2 in this way.

Subsequently, the unillustrated switching driver operates to respectively rotate the movable members 471, 472 clockwise and counterclockwise on the plane of FIG. 6B. This causes the substrate pressing member 433 to be located at a position separated upward from the conveyors 225, 226 by a predetermined clearance CL on the (+X) side of the substrate FB and also causes the substrate pressing member 434 to be located at a position separated upward from the conveyors 225, 226 by a predetermined clearance CL on the (−X) side of the substrate FB.

Subsequently, the controller 3 starts supplying the negative pressure to the back-up member 41. Simultaneously with or subsequent to this, the controller 3 retracts a piston of a cylinder CY downward to integrally lower the conveyor frames 221, 222 and the substrate pressing members 433, 434. After a part of the substrate FB comes into contact with the upper surface 411 of the back-up member 41 to be sucked as shown in FIG. 6C during this lowering movement, an area to be sucked and held spreads over the entire upper surface 411 according to a further lowering movement. Further, when moving to a position lower than the upper surface (substrate suction surface) 411 of the back-up member 41 as shown in FIG. 6D, the conveyors 225, 226 are isolated downward from the substrate FB (i.e. the substrate is separated upward from the pair of conveyors 225, 226) and out of the substrate FB, the entire lower surface of a mounting region MR where the components are to be mounted is sucked and fixed to the upper surface 411 of the back-up member 41.

While the mounting region MR is sucked and held, warpage in non-mounting regions NMR of the substrate FB excluding the mounting region MR is corrected by the substrate pressing members 433, 434. Specifically, the (+X) side substrate pressing member 433 comes into contact with the (+X) side non-mounting region NMR warped upward and then further press this region downward while being lowered together with the conveyor frame 221. This causes all the pressing force by the substrate pressing member 433 to be transmitted to the back-up member 41 via the substrate FB, whereby the warpage in the (+X) side non-mounting region NMR is corrected. Further, the (−X) side substrate pressing member 434 also corrects the warpage in the (−X) side non-mounting region NMR in the same manner as the (+X) side substrate pressing member 433.

When the fixing and correction of the substrate FB are completed, the controller 3 controls each part of the apparatus to mount the components on the surface of the mounting region MR in a state where the non-mounting regions NMR are pressed to correct the warpage by the substrate pressing members 433, 434. When the mounting of the components is completed, the controller 3 stops supplying the negative pressure to the back-up member 41 and releases the suction holes 41a of the back-up member 41 to atmosphere. Further, the controller 3 advances the piston of the cylinder CY upward to integrally elevate the conveyor frames 221, 222, the movable members 471, 472 and the substrate pressing members 433, 434. In this way, the substrate pressing members 433, 434 having pressed the non-mounting regions NMR are slowly separated upward from the non-mounting regions NMR and the substrate FB having the components mounted is transferred from the back-up member 41 onto the conveyors 225, 226.

When the transfer of the substrate from the back-up member 41 to the conveyors 225, 226 is completed, the controller 3 controls the switching driver to respectively rotate the movable members 471, 472 counterclockwise and clockwise on the plane of FIG. 6D. In this way, the substrate pressing members 433, 434 are positioned to the retracted positions. Then, the controller 3 controls the main conveying mechanism 22 and an unloading mechanism 23 to unload the substrate FB from the surface mounting machine 1.

As described above, in this embodiment, the movable members 471, 472 and the substrate pressing members 433, 434 are retracted to the retracted positions in conveying the substrate FB along the conveyance path TP, but the warpage of the outer peripheral part of the substrate FB positioned at the working position P2 is corrected in the same manner as in the first embodiment. Thus, functions similar to those of the first embodiment are obtained.

Note that, in the above embodiments, the back-up member 41 is formed of a suction plate with a plurality of suction holes 41a perforated on the upper surface, and the substrate FB is fixed to the upper surface of the back-up member 41 by supplying the negative pressure to the plurality of suction holes 41a. However, in a substrate working apparatus such as a surface mounting machine, a printing machine or a substrate inspection machine for supporting a substrate FB by a back-up member 41 in which a plurality of suction holes 41a are not arranged on an upper surface, the substrate FB may be held and fixed while the warpage of an outer peripheral part of the substrate FB is corrected by causing substrate pressing forces by the substrate pressing members 431 to 434 to act on the back-up member 41 via the substrate FB separated upward from the pair of conveyors 225, 226.

As just described, in the above embodiments, the conveyor frames 221, 222 respectively correspond to examples of a "first conveyor frame" and a "second conveyor frame" of the disclosure. Further, the pair of conveyors 225, 226 function as a "pair of conveying members" of the disclosure and convey the film-like substrate FB to the working position P2. Further, the substrate pressing members 431 to 434 respectively correspond to examples of a "first substrate pressing member", a "second substrate pressing member", a "third substrate pressing member" and a "fourth substrate pressing member" of the disclosure. Further, the shock absorbing members 441, 442 respectively correspond to examples of the "first shock absorbing member" and the "second shock absorbing member" of the disclosure. Further, the movable members 471, 472 respectively correspond to examples of a "first movable member" and a "second movable member" of the disclosure. Furthermore, the head unit 6 functions as a "substrate working unit" of the disclosure.

Further, the disclosure is not limited to the above embodiments and various modifications can be made to the above ones without departing from the gist of the disclosure. For example, although the substrate pressing members 433, 434 are respectively directly attached to the movable members 471, 472 in the above third embodiment, they may be attached via shock absorbing members as in the second embodiment. Specifically, the opposite ends of the support shafts 473, 474 may be coupled and fixed to upper end parts equivalent to the shafts 461, 462 of the second embodiment instead of being directly fixed to the conveyor frames 221, 222. Biasing forces equivalent to those of the compression coil springs 451, 452 may be caused to act on the substrate pressing members 433, 434 via the support shafts 473, 474 and the movable members 471, 472, and the substrate pressing members 433, 434 may be respectively configured to be movable in the vertical direction Z relative to the conveyor frames 221, 222 while receiving the biasing forces equivalent to those of the compression coil springs 451, 452.

Further, in the above embodiments, the substrate FB is transferred and the warpage thereof is corrected by moving the constituent components (conveyor frames, conveyors, substrate pressing members, etc.) of the main conveying mechanism 22 upward and downward while fixedly arranging the back-up member 41. However, the substrate may be transferred and the warpage thereof may be corrected by moving the back-up member 41 upward and downward while fixedly arranging the main conveying mechanism 22. In this case, the disclosure may be applied to a surface mounting machine in which a substrate conveying unit 2 is so configured as to unite a loading mechanism 21, a main conveying mechanism 22 and an unloading mechanism 23, i.e. to convey a substrate FB to a working position P2 only by a pair of conveyors.

Further, in the above embodiments, the back-up member 41 located in the middle between both conveyor frames 221, 222 is fixedly arranged inside the main conveying mechanism 22, whereas the substrate FB is transferred and the warpage thereof is corrected by moving the constituent components (conveyor frames, conveyors, substrate pressing members, etc.) of the main conveying mechanism 22 located outside the back-up member 41 upward and downward. Thus, the elevation driver comprising the cylinder CY, the shafts SF and the sleeves SL is easily inspected and maintenance management is facilitated.

Further, although the warpage in the end parts of the substrate FB in the Y-axis direction is corrected by the substrate pressing members 431, 432 in the first and second embodiments and the warpage in the end parts of the substrate FB in the X-axis direction is corrected by the substrate pressing members 433, 434 in the third embodiment. The number and arrangement positions of the substrate pressing members are arbitrary without being limited to these. For example, the entire outer peripheral part of the substrate FB may be pressed by the substrate pressing members 431 to 434 to correct the warpage.

Furthermore, although the substrate fixing technique according to the disclosure is applied to the surface mounting machine 1 in the above embodiments, an object of the application of this substrate fixing technique is not limited to this. It can be also applied to an inspection apparatus for inspecting components mounted on a substrate, a dispenser for applying adhesive, etc. to a substrate, a printing apparatus for moving a mask while fixing a substrate to align the substrate and the mask and printing cream solder on a substrate surface, or the like.

In the disclosure configured as described above, a substrate pressing member presses a surface of an outer peripheral part of a substrate downward in a state where the substrate is supported from below by a back-up member at a working position while being separated upward from a pair of conveying members. This causes all the pressing force by the substrate pressing member to be transmitted to the back-up member via the substrate, whereby the substrate is fixed by the substrate pressing member and the back-up member and the warpage of the outer peripheral part of the substrate is successfully corrected. Further, by using such a substrate fixing technique, a predetermined operation can be performed on a surface area of the substrate excluding an area pressed by the substrate pressing member in a state where the warpage of the outer peripheral part of the substrate is corrected, wherefore this operation can be successfully performed. Particularly, even if a fiducial mark is located on the upper surface of the outer peripheral part of the substrate, it can be recognized in a state where the warpage of that part is corrected, correct substrate position and substrate direction can be detected and a subsequent predetermined operation can be successfully performed on the surface area of the substrate.

Here, it may be configured that the back-up member includes a suction hole on an upper surface and sucks and fixes a lower surface of the substrate conveyed to the working position while supporting the lower surface by the upper surface. When the substrate is sucked by the upper surface of the back-up member in this way, even if the substrate pressing member is pressed against the substrate surface to correct the warpage, for example, as in the disclosure disclosed in JP2004-296632A, the outer peripheral part of the substrate is warped if the substrate pressing member is retracted from the substrate surface and, in addition, a suction force decreases near the periphery of the substrate due to that warpage, whereby the warpage further becomes larger. Contrary to this, since the substrate pressing member presses the surface of the outer peripheral part of the substrate downward to correct the warpage in the disclosure, a suction force does not decrease also near the periphery of the substrate and the substrate can be reliably and stably fixed by the back-up member.

Here, it may be configured that the elevation driver moves the substrate pressing member together with the pair of conveying members upward and downward outside the back-up member. This causes the elevation driver to be located outside the back-up member, thereby leading to easy inspection and easy maintenance management.

Further, to lower the substrate pressing member together with the pair of conveying members, the substrate pressing member may be, for example, attached to at least one of a first conveyor frame which supports one of the pair of conveying members and a second conveyor frame which supports the other of the pair of conveying members. In this case, to combine substrate conveyance and substrate correction, the substrate pressing member is preferably separated upward from the pair of conveying members by a distance larger than a sum of a thickness and a warpage amount of the substrate.

Further, the substrate pressing member may include a first substrate pressing member and a second substrate pressing member respectively extending in parallel with the conveyance path. For example, the first substrate pressing member may be attached to the first conveyor frame and the second substrate pressing member may be attached to the second conveyor frame. By adopting such a configuration, opposite end parts of the substrate in a substrate width direction perpendicular to a conveying direction are pressed downward by the first and second substrate pressing members to correct the warpage.

Further, it may be configured that the first substrate pressing member is attached to the first conveyor frame via a first shock absorbing member and the second substrate pressing member is attached to the second conveyor frame via a second shock absorbing member. By inserting the shock absorbing members in this way, the pressing force applied to the surface of the outer peripheral part of the substrate by the substrate pressing member can be stabilized. Further, also in separating the substrate pressing member from the surface of the outer peripheral part of the substrate, a sudden change of the pressing force can be suppressed and a shock acting on the substrate can be alleviated during this separating operation.

Further, the substrate pressing member may include a third substrate pressing member and a fourth substrate pressing member respectively extending in a substrate width direction perpendicular to the conveying direction. Specifically, it may be configured that a first movable member supported movably relative to the first and second conveyor frames at an upstream side of the back-up member in a conveying direction in which the substrate is conveyed, a second movable member supported movably relative to the first and second conveyor frames at a downstream side of the back-up member in the conveying direction, and a switching driver which switches the positions of the first and second movable members by moving the first and second movable members are provided. The substrate pressing member includes a third substrate pressing member and a fourth substrate pressing member respectively extending in a substrate width direction perpendicular to the conveying direction. The third substrate pressing member is attached to the first movable member and the fourth substrate pressing member is attached to the second movable member, and the switching driver moves the third substrate pressing member to a position above the surface of the outer peripheral part of the substrate conveyed to the working position or a first retracted position distant from the conveyance path at the upstream side of the back-up member by a movement of the first movable member and moves the fourth substrate pressing member to a position above the surface of the outer peripheral part of the substrate conveyed to the working position or a second retracted position distant from the conveyance path at the downstream side of the back-up member by a movement of the second movable member. By adopting such a configuration, the opposite end parts of the substrate in the conveying direction are respectively pressed downward by the third and fourth substrate pressing members to correct the warpage.

Further, it may be configured that the third substrate pressing member is attached to the first movable member via a third shock absorbing member and the fourth substrate pressing member is attached to the second movable member via a fourth shock absorbing member, whereby similar functions and effects as in the case of providing the first and second shock absorbing members can be obtained.

According to this disclosure, the substrate pressing member presses the surface of the outer peripheral part of the substrate downward in a state where the substrate is supported from below by the back-up member while being separated upward from the pair of conveying members. Since this causes all the pressing force by the substrate pressing member to be transmitted to the back-up member, a warpage in the outer peripheral part of the substrate can be successfully corrected. Further, a predetermined operation can be performed on a surface area excluding an area pressed by the substrate pressing member in the state where the outer peripheral part of the substrate is pressed by the substrate pressing member and this operation can be successfully performed without being affected by the warpage.

Although the disclosure has been described with reference to specific embodiments, this description is not meant to be construed in a limiting sense. Various modifications of the disclosed embodiment, as well as other embodiments of the present disclosure, will become apparent to persons skilled in the art upon reference to the description of the disclosure. It is therefore contemplated that the appended claims will cover any such modifications or embodiments as fall within the true scope of the disclosure.

What is claimed is:

1. A substrate fixing apparatus comprising:
    a back-up member located between a pair of conveying members arranged at a distance from each other and below a film-like substrate conveyed along a conveyance path, the film-like substrate being supported from below by the pair of conveying members; and
    a substrate pressing member,
    an elevation driver moving at least one of the back-up member and the substrate pressing member upward and downward,
    the elevation driver elevating the back-up member and/or lowering the substrate pressing member, thereby separating the film-like substrate from the pair of conveying members while supporting the film-like substrate from below by the back-up member and pressing a surface of an outer peripheral part of the film-like substrate downward by the substrate pressing member to correct warpage of the outer peripheral part of the substrate.

2. The substrate fixing apparatus according to claim 1, wherein:
    the back-up member includes a suction hole on an upper surface and sucks and fixes a lower surface of the substrate conveyed to a working position while supporting the lower surface of the film-like substrate by the upper surface of the back-up member.

3. The substrate fixing apparatus according to claim 2, wherein:
    the upper surface of the back-up member is located at a position lower than the conveyance path, when the substrate is conveyed.

4. The substrate fixing apparatus according to claim 3, wherein:
    upper surfaces of the pair of conveying members are flush with the conveyance path, when the substrate is conveyed to the working position.

5. The substrate fixing apparatus according to claim 4, wherein:
    when the substrate is conveyed to the working position, the elevation driver elevates the back-up member and/or lowers the substrate pressing member together with the pair of conveying members.

6. The substrate fixing apparatus according to claim 5, wherein:
    negative pressure is supplied to the back-up member when the film-like substrate is conveyed to the working position.

7. The substrate fixing apparatus according to claim 1, wherein:
    the elevation driver moves the substrate pressing member together with the pair of conveying members upward and downward spaced outside of the back-up member.

8. The substrate fixing apparatus according to claim 1, wherein:
    the substrate pressing member is attached to at least one of a first conveyor frame which supports one of the pair of conveying members and a second conveyor frame which supports the other of the pair of conveying members and is separated from the pair of conveying members by a distance larger than a sum of a thickness and a warpage amount of the substrate.

9. The substrate fixing apparatus according to claim 8, wherein:
the substrate pressing member includes a first substrate pressing member and a second substrate pressing member respectively extending in parallel with the conveyance path; and
the first substrate pressing member is attached to the first conveyor frame and the second substrate pressing member is attached to the second conveyor frame.

10. The substrate fixing apparatus according to claim 9, wherein:
the first substrate pressing member is attached to the first conveyor frame via a first shock absorbing member and the second substrate pressing member is attached to the second conveyor frame via a second shock absorbing member.

11. The substrate fixing apparatus according to claim 8, further comprising:
a first movable member supported movably relative to the first and second conveyor frames at an upstream side of the back-up member in a conveying direction in which the substrate is conveyed;
a second movable member supported movably relative to the first and second conveyor frames at a downstream side of the back-up member in the conveying direction; and
a switching driver which switches the positions of the first and second movable members by moving the first and second movable members;
wherein:
the substrate pressing member includes a third substrate pressing member and a fourth substrate pressing member respectively extending in a substrate width direction perpendicular to the conveying direction;
the third substrate pressing member is attached to the first movable member and the fourth substrate pressing member is attached to the second movable member; and
the switching driver moves the third substrate pressing member to a position above the surface of the outer peripheral part of the film-like substrate conveyed to the working position or a first retracted position distant from the conveyance path at the upstream side of the back-up member by a movement of the first movable member and moves the fourth substrate pressing member to a position above the surface of the outer peripheral part of the film-like substrate conveyed to the working position or a second retracted position distant from the conveyance path at the downstream side of the back-up member by a movement of the second movable member.

12. The substrate fixing apparatus according to claim 11, wherein:
the third substrate pressing member is attached to the first movable member via a third shock absorbing member and the fourth substrate pressing member is attached to the second movable member via a fourth shock absorbing member.

13. The substrate fixing apparatus according to claim 1, wherein:
the elevation driver includes a sleeve and a shaft guiding the pair of conveying members while sliding on the sleeve.

14. A substrate working apparatus, comprising:
a substrate conveying unit conveying a film-like substrate along a conveyance path while supporting the film-like substrate from below by a pair of conveying members arranged at a distance from each other;
a substrate fixing unit having a same configuration as a substrate fixing apparatus including
a back-up member located between a pair of conveying members arranged at a distance from each other and below a film-like substrate conveyed along a conveyance path, the film-like substrate being supported from below by the pair of conveying members; and
a substrate pressing member,
an elevation driver moving at least one of the back-up member and the substrate pressing member upward and downward,
the elevation driver elevating the back-up member and/or lowering the substrate pressing member, thereby separating the film-like substrate from the pair of conveying members while supporting the film-like substrate from below by the back-up member and pressing a surface of an outer peripheral part of the film-like substrate downward by the substrate pressing member to correct warpage of the outer peripheral part of the substrate, and the substrate fixing unit being configured to support and fix the film-like substrate conveyed to a working position midway through the conveyance path by the substrate conveying unit; and
a substrate working unit performing a predetermined operation on a surface area of a surface of the film-like substrate fixed by the substrate fixing unit excluding an area pressed by the substrate pressing member.

15. The substrate working apparatus according to claim 14, further comprising:
a head unit which mounts an electronic component on the film-like substrate.

16. The substrate working apparatus according to claim 15, further comprising:
a substrate recognition camera which images the film-like substrate.

17. The substrate working apparatus according to claim 16, wherein:
the substrate recognition camera images a fiducial mark attached to an outer peripheral part of the film-like substrate.

18. The substrate working apparatus according to claim 17, wherein:
a component mounting position set on the film-like substrate is corrected based on an image-recognized substrate position and substrate direction.

* * * * *